United States Patent [19]
Eckels et al.

[11] Patent Number: 5,701,744
[45] Date of Patent: Dec. 30, 1997

[54] MAGNETIC RESONANCE IMAGER WITH HELIUM RECONDENSING

[75] Inventors: Phillip William Eckels, Florence, S.C.; Kazuhiko Sato, Ishikawa-machi, Japan; Daniel Christian Woods, Florence, S.C.; Granville Geer Ward, Florence, S.C.; Gregory Farin Hayworth, Florence, S.C.; Christopher G. King, Florence, S.C.

[73] Assignee: General Electric company, Milwaukee, Wis.

[21] Appl. No.: 741,993

[22] Filed: Oct. 31, 1996

[51] Int. Cl.$^6$ .................. F17C 5/02; H01F 7/22; F25B 19/00

[52] U.S. Cl. .................. 62/47.1; 62/51.1; 324/320; 335/301

[58] Field of Search .................. 62/47.1, 51.1; 324/318, 320; 335/301

[56] References Cited

FOREIGN PATENT DOCUMENTS 04222810  3/1994  Japan .

OTHER PUBLICATIONS

Paper "Realization of Low Magnetic Field in Bi–Sr–Ca–Cu–O Superconducting Cylinder Under Earth Field Cooling" By Matsuba et al. presented at 7th CIMTEC World Ceramic Congress, Jul. 2–3, 1990, Trieste, Italy.

*Primary Examiner*—Christopher Kilner
*Attorney, Agent, or Firm*—Irving M. Freedman; John H. Pilarski

[57] ABSTRACT

A cryogen recondensing system magnetic resonance imager superconducting magnet and a cryogen recondensing system with a rare earth displacement material cryocooler and superconductive lead bismuth magnetic sleeve provides superconducting current flow of currents induced by movement of the rare earth displacer which generate opposing magnetic fields to shield the superconducting magnet from the magnetic interference of the cryocooler rare earth displacer. Strips of high conductivity wave-shaped aluminum or sapphire rods may be embedded in the surface of the sleeve to lower the thermal resistance of the superconducting shield to enable it to quickly reach superconducting temperature.

18 Claims, 2 Drawing Sheets

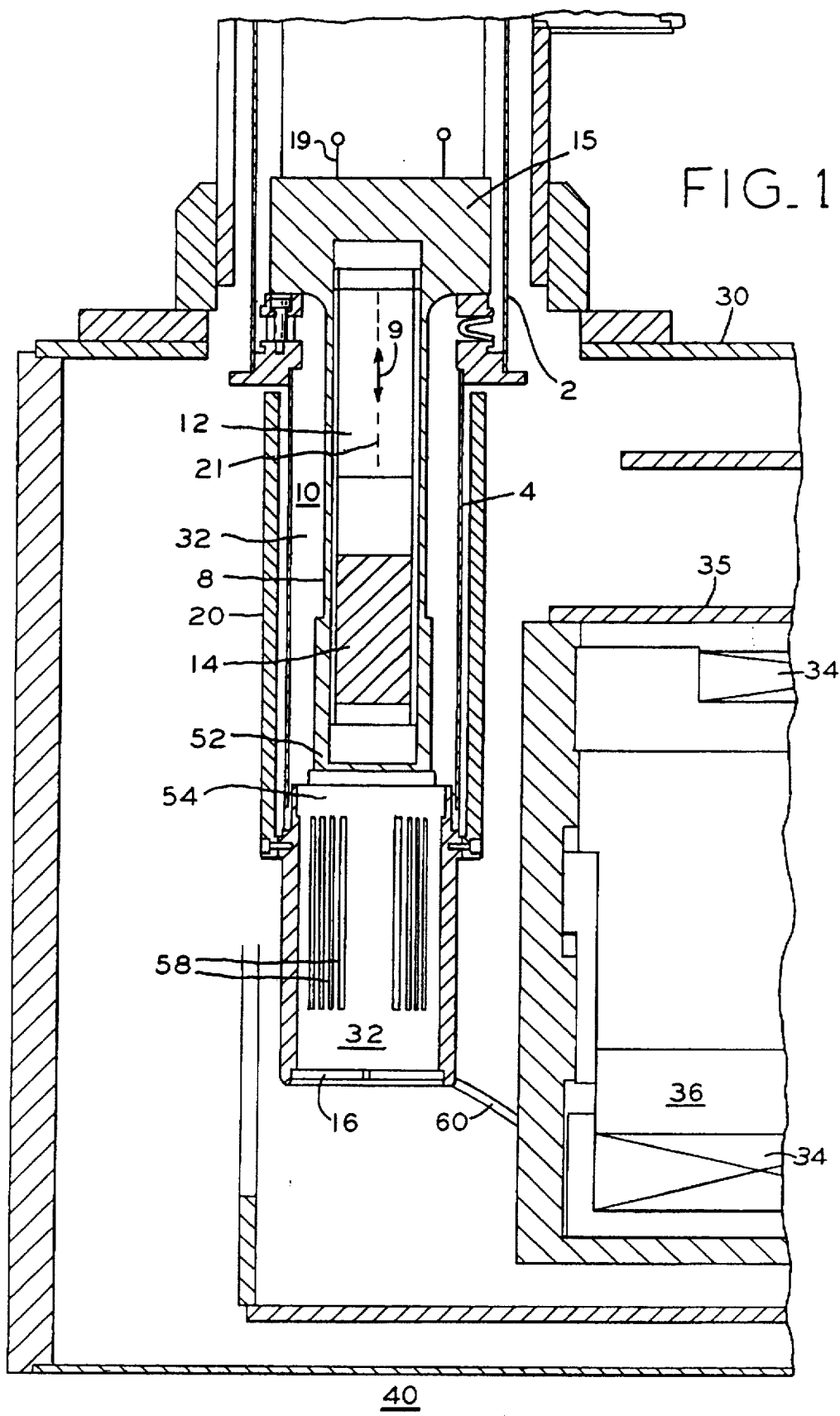
FIG_1

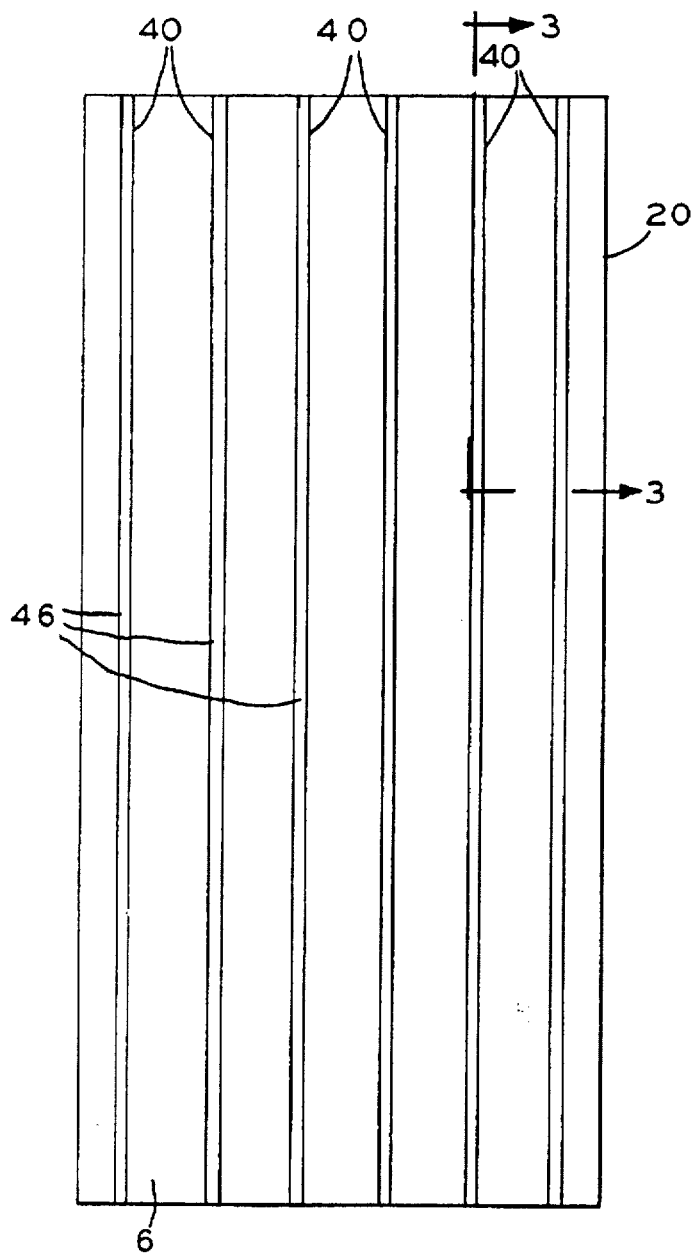
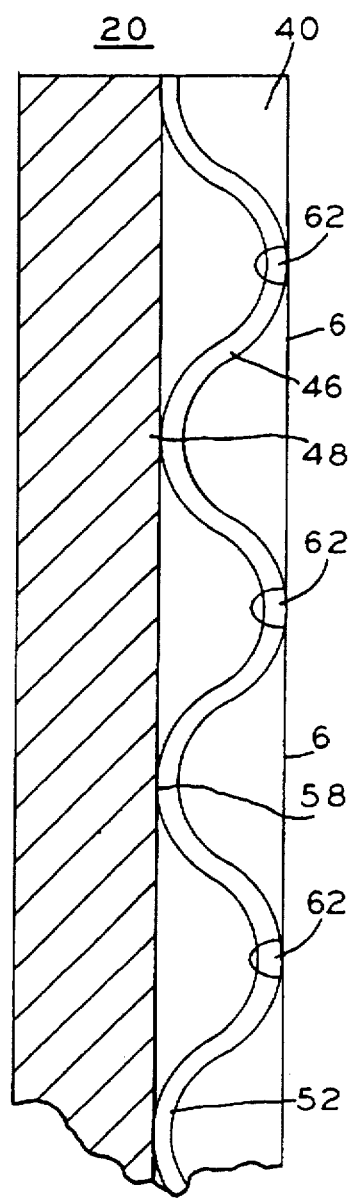
FIG_2  FIG_3

MAGNETIC RESONANCE IMAGER WITH HELIUM RECONDENSING

BACKGROUND OF INVENTION

As is well known, a magnet coil can be made superconducting by placing it in an extremely cold environment, such as by enclosing it in a cryostat or pressure vessel and reducing its temperature to superconducting levels such as 4°–10° Kelvin. The extreme cold reduces the resistance of the magnet coil to negligible levels, such that when a power source is initially connected to the coil for a period of time to introduce a current flow through the coil, the current will continue to flow through the coil due to the negligible coil resistance even after power is removed, thereby maintaining a strong, steady magnetic field. Superconducting magnets find wide application, for example, in the field of magnetic resonance imaging (hereinafter ("MRI").

In a typical MRI magnet, the main superconducting magnet coils are enclosed in a cylindrically shaped pressure vessel which is contained within an evacuated vessel and forms an imaging bore in the center. The main magnet coils develop a strong magnetic field in the imaging bore which must be very homogenous and temporally constant for accurate imaging.

Superconducting temperatures are commonly obtained by boiling a liquid cryogen, typically liquid helium within the pressure vessel. However, while the use of liquid helium to provide cryogenic temperatures is widely practiced and is satisfactory for MRI operation, the provision of a steady supply of liquid helium to MRI installations all over the world and its storage and use has proved to be difficult and costly. As a result, considerable effort has been directed at the use of mechanical displacement type cryocoolers or conduction cooling for condensing and recycling the boiled helium. However, the ability of cryocoolers to provide the necessary amount and required degree cooling has often been marginal. One type of cryocooler that has desirable cooling capacity uses rare earth materials as the displacement material in the moving piston of the compressor of the second or cold stage of a two stage cryocooler. The reciprocating movement of the rare earth materials such as $Er_3Ni$ and ErNiCo produces relatively high heat capacity in the superconducting temperature range of 4°–10° K. due to magnetic transitions.

However, use of certain cryocoolers utilizing ferromagnetic transition rare earth materials in MRI applications causes significant distortions and perturbations of the magnetic field in the MRI imaging volume. The rare earth material in the moving displacer is believed to act as a moving magnet of variable field strength when it becomes magnetized by the local field of a typical superconductive magnet, causing magnetic field fluctuations in the imaging volume of the superconductive magnet, which creates distortions in the images rendered when such a cryocooler is utilized in MRI equipment.

The time varying magnetic fields generated by the moving rare earth displacer can also induce eddy currents in various metallic structures of the main magnet assembly and in the main magnet coils. The goal of the MRI magnet system is the perfect fidelity of the target field in the imaging bore which requires an extremely homogeneous magnetic field in the imaging bore. The presence of eddy currents is most undesirable in MRI applications of rare earth cryocoolers since such eddy currents superimpose a magnetic field on the main magnetic fields.

Moreover, eddy currents in the superconducting magnet structure will generate heat due to the finite electrical resistance of such structures. This is the so called AC heating effects of eddy currents which is an additional problem in providing adequate cooling.

While magnetic shielding arrangements have been used in MRI equipment including bucking coils, and copper and superconducting shields, image quality and other problems discussed above have hindered the attempted use of rare earth cryocoolers in MRI equipment. In copending U.S. patent application Ser. No. 08/583,186 filed Jan. 4, 1996, and assigned to the same assignee as the present invention, a superconducting shield is used to shield the gradient coil in an MRI. While superconducting materials have been proposed for shielding rare earth cryocoolers, materials proposed such as copper/niobium-titanium (NbTi) composite alloys generate heat which will burden, and could even overburden, the cryocooler.

OBJECTS AND SUMMARY OF THE INVENTION

It is an object of the present invention to provide an acceptable and practical rare earth cryocooler for helium recycling in an MRI.

It is a further object of the present invention to provide rare earth cryocooler magnetic shielding in an MRI superconducting magnet which precludes field penetration of the main magnet by the time varying magnet field produced by the cryocooler to minimize AC heat generation while enabling a homogeneous, temporally constant imaging volume field.

In accordance with one form of the present invention, a mechanical displacement rare-earth cryocooler provides cooling for recycling boiled helium in superconducting operation of an MRI. A shielding sleeve is provided around the rare-earth displacer in the terminal portion of the cryocooler housing. The shielding sleeve which is in close proximity to the housing and magnetically coupled to the magnetic fields generated by movement of the rare-earth displacer is selected from superconducting alloys of bismuth. The alloys are selected to provide superconducting current flow of the currents induced in the shield by the magnetic fields generated by magnetization of the rare-earth displacers as well as movement of the rare-earth displacer. These oppose the induced magnetic fields and shield the MRI main magnetic coil from the temporal and spacially varying magnetic fields generated by movement of the rare-earth displacer. More particularly, the sleeve materials include lead bismuth. Strips of high purity, high thermal conductivity aluminum are positioned in grooves in the surface of the lead bismuth alloy in a wave pattern to reduce the thermal resistance of the sleeve and enable it to quickly assume superconducting operation. More particularly, the lead bismuth alloy may be approximately eutectic 60 parts lead, and 40 parts by weight bismuth. The sleeve is positioned around the cavity in the MRI magnet housing in which the cryocooler is positioned or close fitting around the open end of the cryocooler housing through use of thermal grease, including vacuum grease and copper powder.

BRIEF DESCRIPTION OF THE DRAWINGS

The features of the invention believed to be novel are set forth with particularly in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 1 is a cross-sectional view of a cryocooler for zero boiloff MRI cryogen recondensing for an MRI superconducting magnet in accordance with this invention.

FIG. 2 shows details of the superconductive sleeve of FIG. 1.

FIG. 3 is an enlarged cross-section portion of FIG. 2 taken along the line 22 of FIG. 1 showing details of the slots in the superconducting sleeve.

DETAILED DESCRIPTION OF THE INVENTION

As illustrated in FIG. 1, two-stage cryocooler 10 includes a housing 8 forming an internal cylindrical bore 12 in which second stage displacer 14 driven by AC drive motor 15 through mechanical drive 21 reciprocates as indicated by arrow 9. Drive motor 15 is powered by a constant frequency AC power source 19. Second stage displacer 14 is a rare-earth material such as ErNiCo utilized in cryocoolers such as that sold by Sumitomo Heavy Industries under their cold-head model designation RDK-408.

Cryocooler 10 is inserted into sealed cavity 32 formed by walls 2 and 4 within MRI superconducting magnet 30. In operation, the rare-earth materials of second stage displacer 14 have relatively high heat capacity in the 4–10 K. range due to magnetic transitions enabling cryocooler 10 to reduce the temperature of cryogen recondensing apparatus 33 to which it is thermally connected to superconducting temperatures. The thermal connection is made through separable thermal joint 50 which includes copper thermal member 52 on cryocooler 10 and copper thermal member 54 within MRI magnet 30 and forming the bottom surface of cavity 32. This enables the removal of cryocooler 10 without breaking the vacuum within magnet 30 or discontinuing superconducting operation of the magnet. This enables the recondensing and recycling of the boiled cryogen, typically helium gas resulting from the boiling of liquid helium from helium reservoir 36 within pressurized vessel 35 to cool main magnet coils 34 to superconducting temperatures. Details of suitable helium recondensing apparatus to which this invention is applicable are shown in U.S. patent application Ser. No. 08/580,359, filed Dec. 28, 1995 by William E. Chen and assigned to an assignee of the present invention. As shown in that patent application, the helium gas is passed between recondensing surfaces 58 to be recondensed and returned via return 60 as liquid helium to the liquid helium reservoir indicated generally as 36 within pressurized vessel 35 of the MRI superconducting magnet 30. The result is a zero boiloff closed loop helium boiling and recondensing system without the need to replenish boiled helium by periodic additions of external liquid helium. The recondensing surfaces 58 are formed by slots in thermal member 54 through which the helium gas flows to be recondensed.

Displacer 14 is driven at a constant frequency and amplitude by AC drive motor 15 and it is believed that the rare-earth material in the moving displacer acts as a moving magnet generating strong varying magnetic fields which can interact with the magnetic fields produced by main magnet coils 34 of MRI superconducting magnet 30 causing magnetic fields fluctuations in the imaging volume or bore 40 of the MRI superconducting magnet. The magnetic field generated by the moving second stage displacer 14 must accordingly, be minimized and/or prevented from interfering with the magnetic homogeneity within central imaging bore or volume 40 in order to avoid distortions in the imaging quality if the rare earth cryocooler 10 is to be suitable and practical for use in MRI imaging.

Superconducting sleeve 20 is fitted around cavity 32 in the region surrounding second stage displacer 14 of the second stage of cryocooler 10. Superconductive sleeve 20 is preferably lead-bismuth which is cast into the shape of a cylinder. Lead-bismuth alloys have proven to exhibit desirable limiting current characteristics in the event of a quenching, or discontinuing superconducting operation, of a superconducting magnet. The forces which result from a rapidly collapsing magnetic field are not as severe as those which may result, for example, from niobium titanium alloys, and as a result the forces between the shield and magnet coils such as 34 are less severe. Since PbBi exists as two separate phases which can separate, quenching and full mixing are necessary to achieve the highest critical currents of the PbBi superconductive shield 20. However, the lead-bismuth alloy provides high thermal resistance which can prevent the shield from reaching a low enough temperature to be superconductive.

Superconductive shield or sleeve 20 utilizes alloys such as approximately 60 parts lead, and 40 parts (by weight) bismuth; and 48 parts bismuth, 13 parts cadmium, 26 parts lead and 13 parts tin. Such a shield can provide shielding that reduce AC magnetic fields by an order of 100.

High purity aluminum strips are provided within slots or grooves in superconductive sleeve 20 to lower the thermal resistance of the shield as shown in FIGS. 2 and 3 without electrically shunting the PbBi and, thereby without allowing eddy currents when the shield is warm and cooling down.

Referring next to FIGS. 2 and 3, the outer surface 6 of superconductive shield 20 includes a plurality of high purity (RRR or residual resistance ratio of 8000) aluminum strips 46 positioned within axially extending slots 40. Slots 40 are approximately 1/8" wide and 1/8" deep and are spaced equidistant around the outer circumferential surface 6 of 1/4" thick sleeve 20. Aluminum strips 46 must have less than 5 parts per billion of bismuth and have a cross-section of approximately 1.5 by 2.0 millimeters. To compensate for the different rates of thermal contraction and expansion between lead-bismuth and aluminum, aluminum strips 30 are formed in curved or wave patterns as discussed below.

Aluminum strips 46 are fabricated from high purity aluminum such as that sold by VAW under their designation of UTH-1 purity grade 5N5. After being bent into the generally sinusoidal wave pattern shown in FIG. 3, the apex or contact regions such as 48, 50 and 52 may be coated with a polymer such as formvar to prevent the poisoning of the aluminum by bismuth by isolating the contact regions. Alternatively, and preferably, the entire strip 46 could be coated with the polymer. After the protected aluminum strips 46 are inserted into grooves 44 they are retained in place by peening or deforming the outer surface 6 of relatively soft sleeve 20 to overlay aluminum strips 46 with spaced retainers 62 along slots 44 such as those shown in FIG. 3. It is also possible as an alternative retaining means to cast strips 46 with heavy aluminum oxide directly into slots 44 or to provide one or more bands (not shown) around outer surface 6 of sleeve 20. Also, sapphire rods, although more expensive, could be used in place of aluminum strips 46.

The wave pattern of strips 46 in slots 44 provides a corrugated assembly with approximately two contact points per inch along the length of slots 40. While the thermal conductivity of strips 46 decreases due to the mechanical bending and peening it has been found to remain sufficiently high to provide adequate thermal conductivity to enable sleeve 20 to be quickly cooled to superconducting temperatures. Also, since the lead bismuth sleeve 20 does not generate heat such as that generated by materials such as niobium titanium/copper composite the cooling capability of MRI superconducting magnet 30 and in particularly cryocooler 10 is not overburdened.

The present invention is particularly applicable to MRI superconducting magnets of the magnitude of 0.5–1.5 tesla.

Superconductive shield 20 eliminates magnetic field penetration of time varying magnetic fields produced by second stage displacer 14 of cryocooler 10 and effectively magnetically shields the main magnet coils 34 from the magnetic disturbances of the second stage displacer 14, providing a shield which has minimum AC heating (typically less than a few milliwatts) and very long (more than a thousand seconds) and even substantially infinite time constants.

Since superconductive shield 20 is a continuous superconducting sheet, it can contain an infinite number of superconducting loops to enable continuous generation of the magnetic fields induced to shield main magnet field coils 34 of MRI superconducting magnet 30 from the magnetic field perturbations of cryocooler 10 and prevent them from adversely affecting the magnetic field within imaging volume 40 of the MRI bore. This enables main magnet coils 34 and associated coils (not shown) to provide the desired and necessary field homogeneity and stability without undue magnetic interference from cryocooler 10 rare earth second stage displacer 14.

Sleeve 20 in one embodiment is snugly fit around the cylindrical outer surface of housing 8 of superconductive cryocooler 10 using thermal grease which is vacuum grease including copper powder or solder to provide good thermal contact and magnetic coupling with second stage displacer 14 of the cryocooler.

While only certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A cryogen recondensing system with a mechanical cryocooler utilizing a rare earth displacer for a magnetic resonance imager superconducting magnet comprising:

a sleeve surrounding said cryocooler rare earth displacer;

said sleeve being magnetically coupled to the magnetic fields generated by the movement of said rare earth displacer;

said sleeve including a lead alloy which provide superconducting flow of currents induced in said shield by said magnetic fields; and high thermal conductivity members along the surface of said sleeve;

said superconducting current flow opposing said induced magnet fields to shield said superconducting magnet from said magnetic fields generated by said movement of said rare earth displacer; and said cryocooler thermally connected to cryogen recondensing means.

2. The superconducting magnet cryogen recondenser of claim 1 wherein high thermal conductivity members are positioned along the surface of said sleeve.

3. The superconducting magnet cryogen recondenser of claim 2 wherein said superconducting magnet includes a closed cavity therein and said cryocooler is removably positioned within said cavity.

4. The superconducting magnet cryogen recondenser of claim 2 wherein said sleeve is a lead-bismuth alloy and said thermal conductivity members are aluminum strips to reduce the thermal resistance of said sleeve.

5. The superconducting magnet cryogen recondenser of claim 4 wherein said aluminum strips high purity aluminum bent into a wave pattern within grooves on said sleeve and a polymer interface is provided between said aluminum and said sleeve.

6. The superconducting magnet cryogen recondenser of claim 5 in which said wave pattern of said aluminum strips is approximately sinusoidal.

7. The superconducting magnet cryogen recondenser of claim 6 wherein said aluminum strips have a cross-section of approximately 1.5 by 2.0 millimeters with in excess of ten slots axially spaced around the circumference of said sleeve.

8. The superconducting magnet cryogen recondenser of claim 2 wherein said sleeve is a lead bismuth alloy and includes a plurality of embedded sapphire rods to reduce the thermal resistance of said sleeve.

9. The superconducting magnet cryogen recondenser of claim 3 wherein said lead alloy is approximately 15.5 parts by weight tin, 32 parts lead and 52.5 parts bismuth.

10. The superconducting magnet cryogen recondenser of claim 3 wherein said lead alloy includes approximately 40–46 parts bismuth and 60–54 parts lead.

11. The superconducting magnet cryogen recondenser of claim 1 wherein said lead alloy is approximately 48 parts lead, 13 parts cadmium and 13 parts tin.

12. The superconducting magnet cryogen recondenser of claim 3 wherein said sleeve is positioned around said cavity.

13. The superconducting magnet cryogen recondenser of claim 12 wherein said cryocooler is a multi-stage cryocooler and said magnetic shield surrounds the coldest stage of said cryocooler.

14. The superconducting magnet cryogen recondenser of claim 3 wherein said cryogen is helium.

15. The superconducting magnet cryogen recondenser of claim 13 wherein said aluminum strips are positioned in axial extending grooves on the outer surface of said sleeve and retained in place.

16. The superconducting magnet cryogen recondenser of claim 14 wherein said aluminum strips are retained in place by retaining members comprising deformations of said sleeve overlying portions of said aluminum strips.

17. The superconducting magnet cryogen recondenser of claim 14 wherein said shield is approximately ⅛ inches thick, said cryocooler is a multi-stage cryocooler, and said shield surrounds the coldest stage of said multi-stage cryocooler.

18. The superconducting magnet cryogen recondenser of claim 4 wherein said cryocooler includes an outer housing and said sleeve closely fits around said cryocooler housing with thermal grease between said housing and said sleeve.

* * * * *